United States Patent
Miwa

(10) Patent No.: US 9,071,199 B2
(45) Date of Patent: Jun. 30, 2015

(54) HIGH FREQUENCY POWER AMPLIFIER

(71) Applicant: Mitsubishi Electric Corporation, Tokyo (JP)

(72) Inventor: Shinichi Miwa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/095,446

(22) Filed: Dec. 3, 2013

(65) Prior Publication Data

US 2014/0266495 A1 Sep. 18, 2014

(30) Foreign Application Priority Data

Mar. 13, 2013 (JP) .................................. 2013-050648

(51) Int. Cl.
*H03F 3/191* (2006.01)
*H03F 3/16* (2006.01)
*H03F 3/24* (2006.01)

(52) U.S. Cl.
CPC . *H03F 3/16* (2013.01); *H03F 3/245* (2013.01)

(58) Field of Classification Search
CPC ........................................................ H03F 3/16
USPC ............ 333/32; 257/287, 192, 341, 343, 401, 257/728; 330/302, 277, 286, 295, 307
See application file for complete search history.

(56) References Cited

U.S. PATENT DOCUMENTS

| 5,233,313 | A * | 8/1993 | Kohno et al. ................. 330/277 |
| 5,477,083 | A * | 12/1995 | Kawai ............................ 257/701 |
| 7,030,715 | B2 * | 4/2006 | Maeda et al. .................. 333/128 |
| 7,061,329 | B2 * | 6/2006 | Inoue et al. .................... 330/302 |
| 7,312,482 | B2 * | 12/2007 | Nakajima et al. ............. 257/159 |
| 8,431,973 | B2 * | 4/2013 | Takagi .......................... 257/287 |
| 2002/0186091 | A1 | 12/2002 | Maeda et al. |

FOREIGN PATENT DOCUMENTS

| JP | 10-335575 A | 12/1998 |
| JP | 2002-335136 A | 11/2002 |

* cited by examiner

*Primary Examiner* — Dinh Le

(74) *Attorney, Agent, or Firm* — Leydig, Voit & Mayer, Ltd.

(57) ABSTRACT

A high frequency power amplifier includes an FET chip, a wire connected at a first end to the FET chip, an input-side matching circuit substrate, a resistive element on the input-side matching circuit substrate and connected in series with the FET chip, a transmission portion of a conductive material on the input-side matching circuit substrate, in contact with one end of the resistive element, and connected to an input electrode, a wire connection portion of a conductive material on the input-side matching circuit substrate, in contact with a second end of the resistive element, and connected to a second end of the wire, and a shorting portion of a conductive material having a smaller width than the resistive element and on the resistive element, connecting the transmission portion to the wire connection portion.

5 Claims, 6 Drawing Sheets

US 9,071,199 B2

HIGH FREQUENCY POWER AMPLIFIER

BACKGROUND OF THE INVENTION

1. Field of the Invention

The present invention relates to a high frequency power amplifier used for amplifying high frequency signals.

2. Background Art

Japanese Laid-Open Patent Publication No. H10-335575 discloses a high frequency power amplifier in which wiring patterns (or transmission wiring patterns) are provided with resistive elements. This high frequency power amplifier also has shunt wires which shunt or short-circuit the resistive elements. The resistive elements are formed at locations substantially spaced apart from the FET chip.

An effective way to minimize oscillation in a high frequency power amplifier is to dispose a resistive element on a matching circuit substrate(s) of the amplifier so as to reduce the reflection gain. A substantial reduction in the reflection gain can be achieved by positioning this resistive element at a minimal distance from the FET chip (or field effect transistors). However, locating the resistive element in close proximity to the FET chip results in degradation in the high frequency characteristics of the high frequency power amplifier, such as the actual gain. It is, therefore, preferable to reduce the resistance value of the resistive element to minimize such degradation in the high frequency characteristics of the high frequency power amplifier.

The high frequency power amplifier disclosed in the above publication is disadvantageous in that since the resistive elements are formed at locations substantially spaced apart from the FET chip, they do not adequately suppress oscillation in the amplifier.

SUMMARY OF THE INVENTION

The present invention has been made to solve the above problems. It is, therefore, an object of the present invention to provide a high frequency power amplifier in which a resistive element is provided on a matching circuit substrate at a location close to the FET chip in such a manner as to minimize degradation in the high frequency characteristics of the high frequency power amplifier while suppressing oscillation in the amplifier.

The features and advantages of the present invention may be summarized as follows.

According to one aspect of the present invention, a high frequency power amplifier includes an FET chip, a wire connected at one end to the FET chip, an input-side matching circuit substrate, a resistive element formed on the input-side matching circuit substrate and connected in series with the FET chip, a transmission portion of a conductive material formed on the input-side matching circuit substrate and in contact with one end of the resistive element and connected to an input electrode, a wire connection portion of a conductive material formed on the input-side matching circuit substrate and in contact with the other end of the resistive element and connected to the other end of the wire, and a shorting portion of a conductive material having a smaller width than the resistive element and formed on the resistive element so as to connect the transmission portion to the wire connection portion.

Other and further objects, features and advantages of the invention will appear more fully from the following description.

DETAILED DESCRIPTION OF THE PREFERRED EMBODIMENTS

High frequency power amplifiers in accordance with embodiments of the present invention will be described with reference to the accompanying drawings. Throughout this specification the same or corresponding components are designated by the same reference symbols and may be described only once.

First Embodiment

Figure 1:
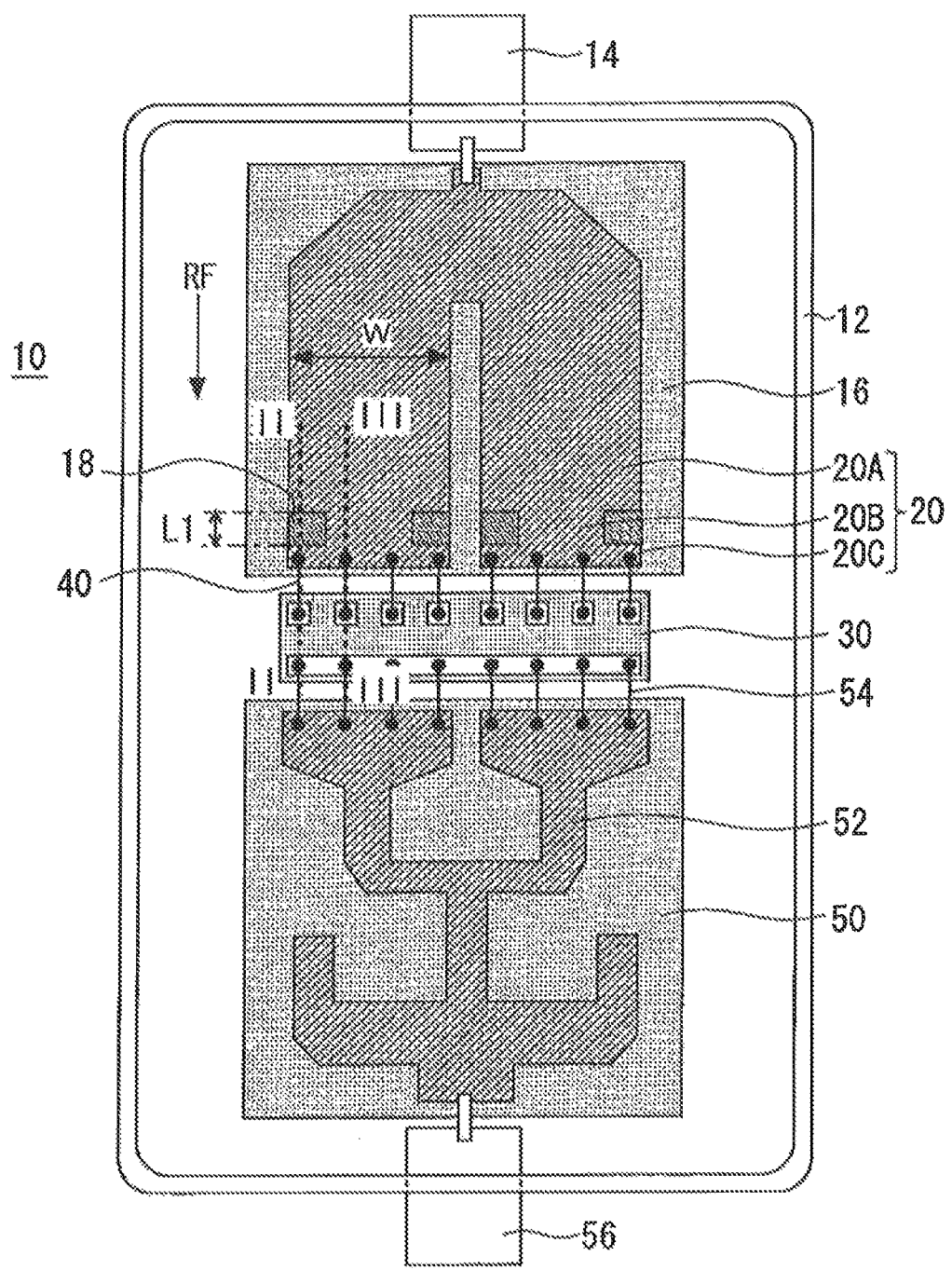
FIG. 1 is a plan view of a high frequency power amplifier in accordance with a first embodiment of the present invention.

FIG. 1 is a plan view of a high frequency power amplifier in accordance with a first embodiment of the present invention. The high frequency power amplifier 10 has a metal package 12. An input electrode 14 is secured to the metal package 12. An input-side matching circuit substrate 16 is mounted in the metal package 12. Two resistive elements 18 are formed on the input-side matching circuit substrate 16. The resistive elements 18 are made of TaN.

A wiring pattern 20 is formed on the input-side matching circuit substrate 16. The wiring pattern 20 is made of, e.g., gold. The wiring pattern 20 includes a transmission portion 20A, two shorting portions 20B, and two wire connection portions 20C, all of which are integrally formed together. The transmission portion 20A is formed of a conductive material and is disposed on the input-side matching circuit substrate 16 and in contact with one end of each resistive element 18. The side of the transmission portion 20A opposite that in contact with the resistive elements 18 is connected to the input electrode 14.

Each wire connection portions 20C is formed of a conductive material and is disposed on the input-side matching circuit substrate 16 and in contact with the other end of a respective resistive element 18. Wires 40 are connected to the wire connection portions 20C. Each shorting portion 20B is formed of a conductive material and is disposed on a respective resistive element 18 in such a manner as to connect the transmission portion 20A to a respective wire connection portion 20C. The width of the shorting portions 20B is smaller than the width W of the resistive elements 18. A portion of the resistive element 18 is located below the each of the shorting portion 20B. The width of each shorting portion 20B is W.

An FET chip 30 is disposed adjacent the input-side matching circuit substrate 16. The FET chip 30 is connected to the wire connection portions 20C by the wires 40. That is, each wire 40 is connected at one end to the FET chip 30 and at the other end to one of the wire connection portions 20C.

An output-side matching circuit substrate 50 is disposed adjacent the FET chip 30. A wiring pattern 52 of, e.g., gold is formed on the output-side matching circuit substrate 50. The wiring pattern 52 is connected to the FET chip 30 by wires 54. An output electrode 56 is connected to the wiring pattern 52.

Figure 2:
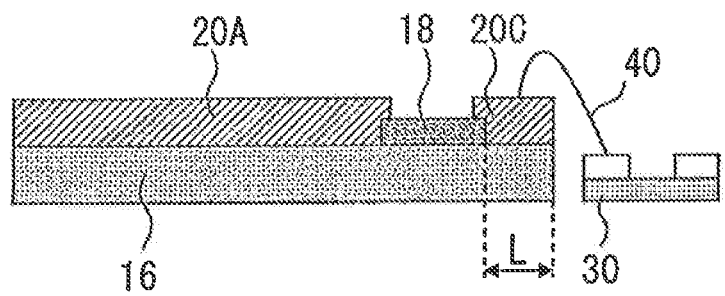
FIG. 2 is a cross-sectional view taken along dashed line II-II of FIG. 1.
Figure 3:
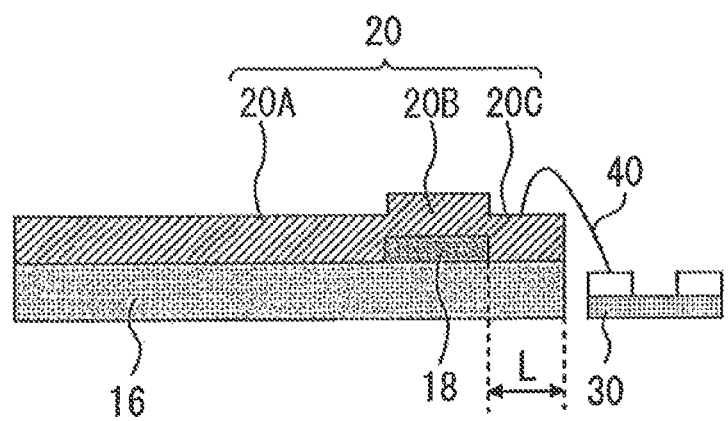
FIG. 3 is a cross-sectional view taken along dashed line III-III of FIG. 1.

FIG. 2 is a cross-sectional view taken along dashed line II-II of FIG. 1. The length of the wire connection portions 20C as measured along the direction of transmission of the high frequency signal (and indicated by the letter L in FIG. 2) is in the range of 50-100 μm. FIG. 3 is a cross-sectional view taken along dashed line III-III of FIG. 1. Each shorting portion 20B is formed on a respective resistive element 18 and shunts or short-circuits a portion of the resistive element 18.

The operation of the high frequency power amplifier 10 will now be described. A high frequency signal is applied to the input electrode 14 and passes through the wiring pattern 20, the FET chip 30, and the wiring pattern 52 to the output electrode 56. Since each resistive element 18, which is electrically connected in series with the FET chip 30, is shunted or short-circuited by a respective shorting portion 20B, the resistive element 18 and the shorting portion 20B together serve as a very low resistive component connected in series with the wiring pattern 20.

Figure 4:
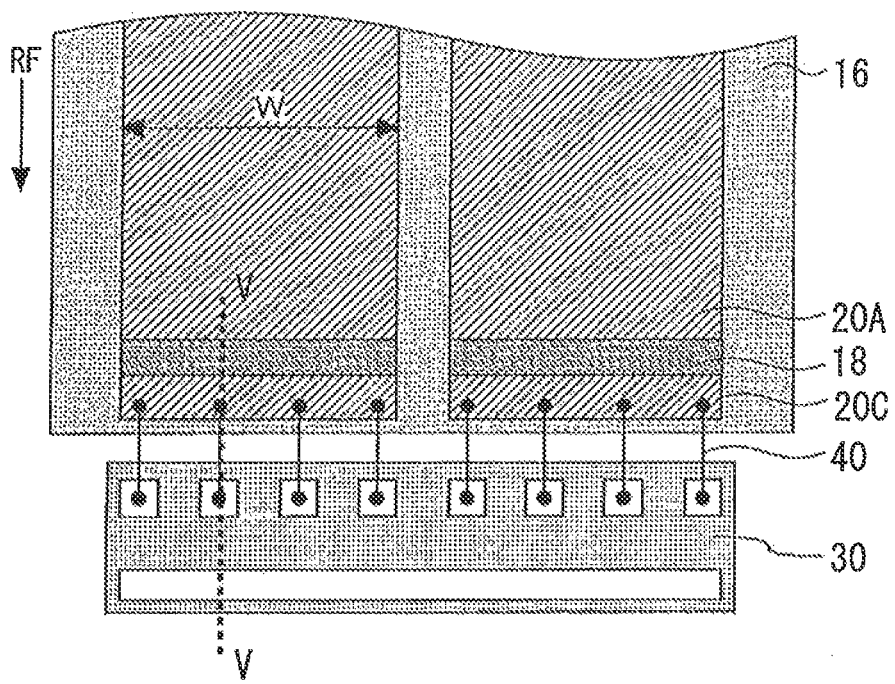
FIG. 4 is a plan view of a high frequency power amplifier of a first comparative example.
Figure 5:
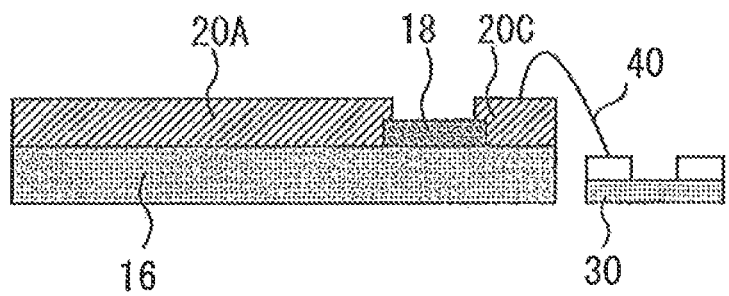
FIG. 5 is a cross-sectional view taken along dashed line V-V of FIG. 4.

To facilitate the understanding of the high frequency power amplifier of the first embodiment, the following description will be directed to comparative examples. FIG. 4 is a plan view of a high frequency power amplifier of a first comparative example. The following description of the first comparative example will be limited to the differences from the first embodiment. The high frequency power amplifier of the first comparative example does not have the shorting portions 20B and hence the wire connection portions 20C are connected to the transmission portion 20A only by the resistive elements 18. FIG. 5 is a cross-sectional view taken along dashed line V-V of FIG. 4.

Figure 6:
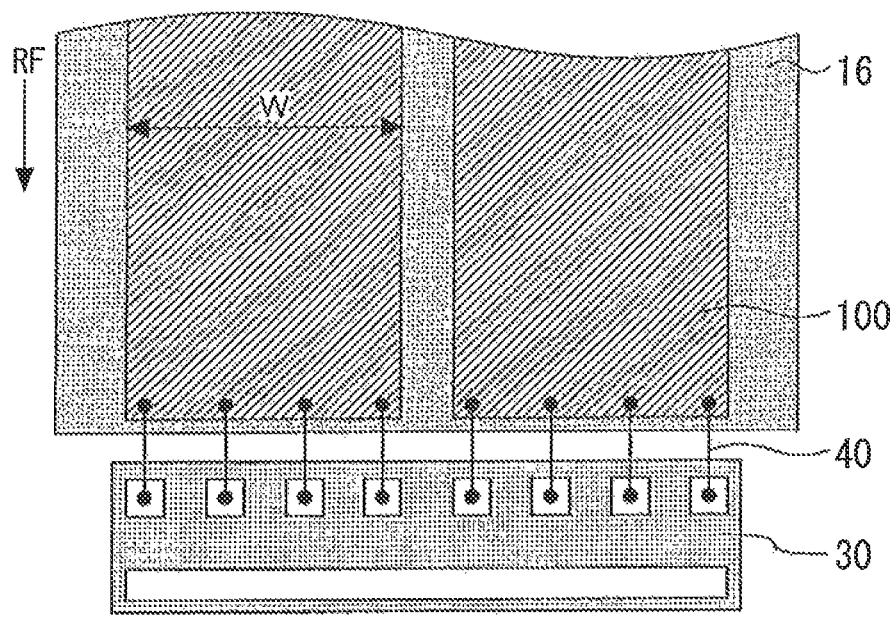
FIG. 6 is a plan view of a high frequency power amplifier of a second comparative example.

FIG. 6 is a plan view of a high frequency power amplifier of a second comparative example. The following description of the second comparative example will be limited to the differences from the first embodiment. The high frequency power amplifier of the second comparative example does not have the resistive elements 18 and has a wiring pattern 100 instead of the wiring pattern 20 of the first embodiment. The wiring pattern 100 does not have shorting portions; that is, the wiring pattern 100 is uniform and flat and is directly connected to the FET chip 30 by the wires 40.

Figure 7:
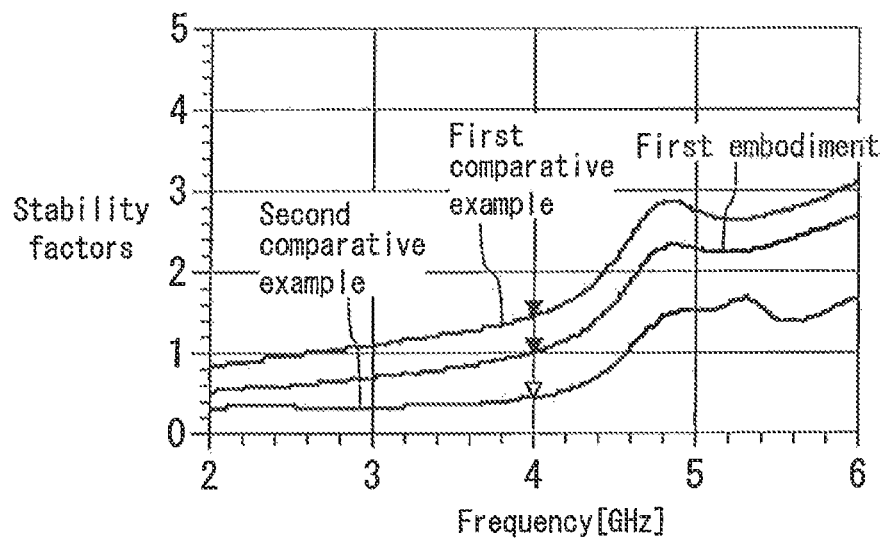
FIG. 7 shows simulation results.

FIG. 7 shows simulation results of the stability factors (or K factors) of the high frequency power amplifiers of the first and second comparative examples and the first embodiment. These simulations assumed an operating frequency of 4 GHz. Further, the simulation for the first comparative example assumed that the resistive elements 18 have a minimal sheet resistance (1Ω). It should be noted that the high frequency power amplifiers of the first and second comparative examples and the first embodiment are similar to one another, except for the differences described above, that is, the presence or absence of the shorting portions 20B, and the presence or absence of the resistive elements 18.

As shown in FIG. 7, the high frequency power amplifier of the first comparative example has a stability factor of more than 1 at 4 GHz and hence is stable. The high frequency power amplifier of the second comparative example, on the other hand, has a stability factor of less than 1 at 4 GHz, since it does not have the resistive elements 18 of the first embodiment or the first comparative example.

Figure 8:
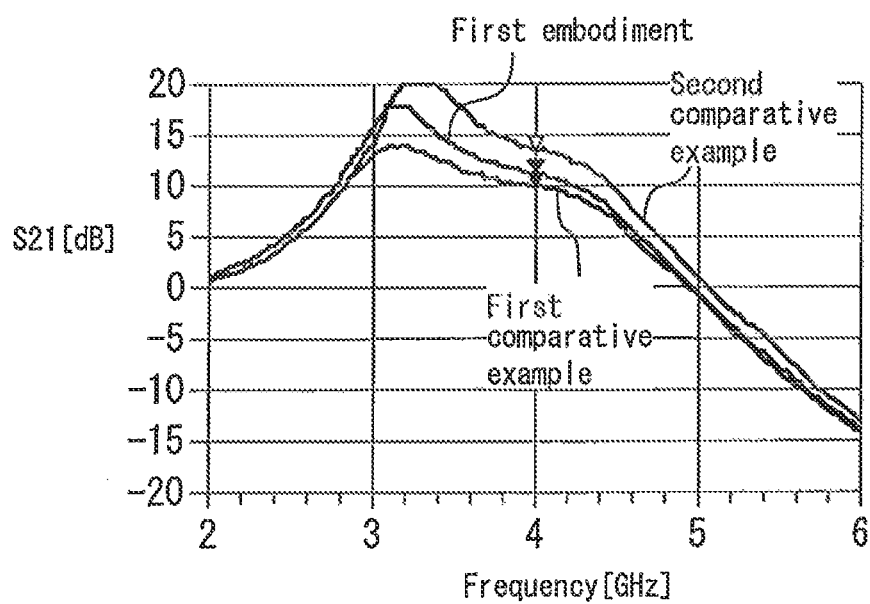
FIG. 8 shows simulation results.

FIG. 8 shows simulation results of the transmission characteristics (S21) of the high frequency power amplifiers of the first and second comparative examples and the first embodiment. The simulation conditions are similar to those for the above simulation of the stability factors of the high frequency power amplifiers. As can be seen from FIG. 8, the high frequency power amplifier of the first comparative example has a degraded high frequency transmission characteristic (S21) due to the resistive elements 18 provided therein. The high frequency power amplifier of the second comparative example, on the other hand, has a relatively good high frequency transmission characteristic (S21), since it does not have the resistive elements 18 of the first embodiment or the first comparative example.

In the case of the high frequency power amplifier of the first comparative example, the resistive elements 18 serve to increase the stability factor of the amplifier, but at a sacrifice of high frequency characteristics. On the other hand, the high frequency power amplifier of the second comparative example, which does not have the resistive elements 18 of the first embodiment or the first comparative example, has good high frequency characteristics, but exhibits a relatively low stability factor. The high frequency power amplifier 10 of the first embodiment is somewhere between the high frequency power amplifiers of the first and second comparative examples in terms of stability factor and high frequency characteristics; that is, the high frequency power amplifier 10 has a relatively high stability factor without substantial sacrifice of high frequency characteristics. This feature will be described below.

The impedance between the FET chip 30 and a point on the conductive path, or the wiring pattern 20, extending from the FET chip 30 to the input electrode 14 decreases with decreasing distance of the point from the FET chip 30. It should be noted that the stability factor of the high frequency power amplifier can be improved by inserting the resistive elements 18 into the wiring pattern 20 if the impedance between the insertion point of each resistive element 18 and the FET chip 30 is low. This is true even when the resistive elements 18 have a very small resistance value (e.g., 1Ω or less). Therefore, in order to increase the stability factor of the high frequency power amplifier, it is important to insert each resistive element 18 into the wiring pattern 20 at the closest possible point to the FET chip 30.

In the high frequency power amplifier 10 of the first embodiment, the resistive elements 18 are disposed in very close proximity to the FET chip 30, making it possible to increase the stability factor of the high frequency power amplifier 10 and thereby minimize oscillation. Specifically, since the length of the wire connection portions 20C (as measured along the direction of transmission of the high frequency signal) is in the range of 50-100 μm, if each wire 40 is connected at one end to one of the wiring connection portions 20C at the center of its length, the distance between that end of the wire 40 and the facing resistive element 18 is in the range of 25-50 μm.

It should be noted that in the high frequency power amplifier disclosed in the above Patent Publication No. H10-335575, resistive elements are formed in portions of wiring patterns at points substantially spaced apart from the FET chip. In this case, since the impedance between the FET chip and these points is relatively high, the resistive elements have little effect in increasing the stability factor of the high frequency power amplifier.

In the high frequency power amplifier of the first embodiment, the resistive elements 18 are shunted or short-circuited by the shorting portions 20B, making it possible to suppress oscillation in the amplifier without substantial sacrifice of high frequency characteristics. Specifically, the effective resistance of each resistive element 18 shunted or short-circuited by a respective shorting portion 20B is very low (e.g., 1Ω). The resistance value R of each resistive element 18 (not shunted) is represented by the equation: $R = R_{sheet} \times (L1/W)$, where Rsheet is the sheet resistance, L1 is the length of the resistive element 18 as measured along the direction of transmission of the high frequency signal, and W is the width of the resistive element 18 (see FIG. 1). Thus in the high frequency power amplifier of the first embodiment, the resistive elements 18 are disposed in close proximity to the FET chip 30 so as to suppress oscillation in the amplifier. This does not result in a substantial sacrifice of high frequency characteristics, since each resistive element 18 is shunted or short-circuited by a respective shorting portion 20B and hence has a relatively low effective resistance.

The current flowing through the wiring pattern 20 at points close to the FET chip 30 has a relatively large amplitude. Therefore, care must be taken so that the resistive elements 18 are not damaged by joule heat. In the first embodiment, since the high frequency current flowing through the transmission portion 20A is distributed into the resistive elements 18 and the shorting portions 20B connected in parallel with each other, only a small amount of current flows through the resistive elements 18 and hence only a small amount of heat is generated in them, as compared with the resistive elements 18 of the first comparative example. This prevents damage to the resistive elements 18 due to joule heat even if a high level of high frequency power is input to the high frequency power amplifier.

In the high frequency power amplifier of the present invention described above, the resistive elements 18 are disposed in very close proximity to the FET chip 30, and portions of the resistive elements 18 are shunted or short-circuited by the shorting portions 20B so that the effective resistance of each resistive element 18 is an optimum value. Various alterations may be made to the high frequency power amplifier 10 while retaining this feature. For example, the resistive elements 18 may be formed of tungsten nitride, etc. instead of TaN. Further, the length of the connection portions 20C need not necessarily be in the range of 50-100 μm; the connection portions 20C only need to be long enough that wires can be bonded to them. It should be noted that the above alterations to the first embodiment may also be made to the subsequently described embodiments.

Second Embodiment

Figure 9:
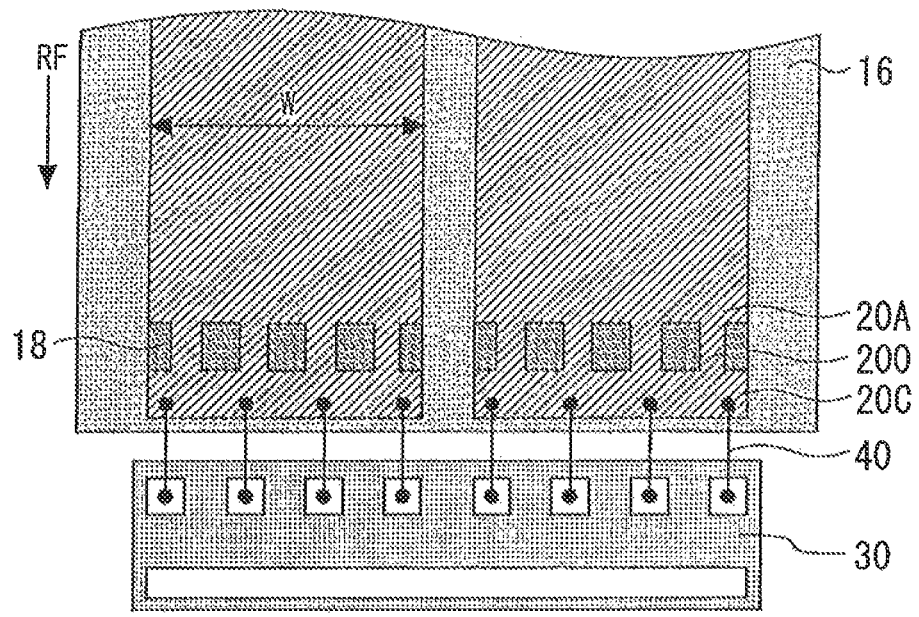
FIG. 9 is a plan view of the high frequency power amplifier of the second embodiment.

A second embodiment of the present invention provides a high frequency power amplifier which has many features common to the high frequency power amplifier of the first embodiment. Therefore, the following description of the second embodiment will be primarily limited to the differences from the first embodiment. FIG. 9 is a plan view of the high frequency power amplifier of the second embodiment. This high frequency power amplifier includes a plurality of, namely eight, shorting portions 200 instead of the shorting portions 20B of the first embodiment. These shorting portions 200 have a smaller width than the shorting portions 20B. The width of each shorting portion 200 may be adjusted to adjust the high frequency characteristics and the stability factor of the high frequency power amplifier.

Third Embodiment

Figure 10:
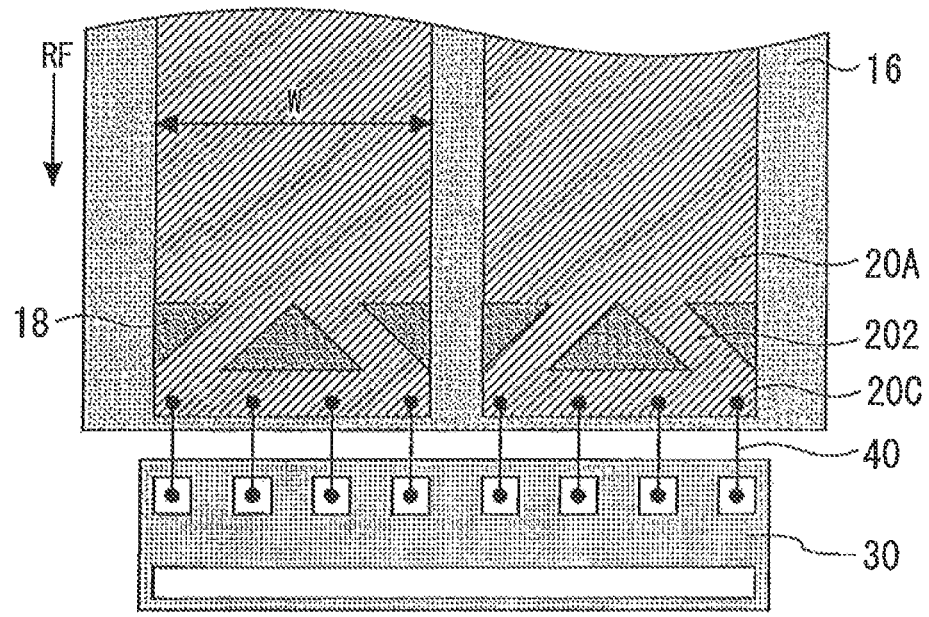
FIG. 10 is a plan view of the high frequency power amplifier of the third embodiment.

A third embodiment of the present invention provides a high frequency power amplifier which has many features common to the high frequency power amplifier of the first embodiment. Therefore, the following description of the third embodiment will be primarily limited to the differences from the first embodiment. FIG. 10 is a plan view of the high frequency power amplifier of the third embodiment. This high frequency power amplifier includes shorting portions 202 instead of the shorting portions 20B of the first embodiment. These shorting portions 202 are formed to extend obliquely relative to the direction of transmission of the high frequency signal, as shown in FIG. 10. As a result, the length of the shorting portions 202 is greater than the minimum length required to connect the wire connection portions 20C to the transmission portion 20A.

Thus, the shorting portions 202 have a longer length and hence a higher impedance than the shorting portions 20B of the first embodiment. The higher impedance of the shorting portions 202 facilitates impedance matching (among other advantages). The present embodiment is particularly effective when the high frequency power amplifier processes high frequency signals having 10 GHz or higher frequencies.

Thus the present invention provides a high frequency power amplifier in which a resistive element having a low resistance value is provided on the input-side matching circuit substrate at a location close to the FET chip, thereby suppressing oscillation in the high frequency power amplifier while minimizing degradation in the high frequency characteristics of the amplifier.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-050648, filed on Mar. 13, 2013. including specification, claims, drawings, and summary, on which the Convention priority of the present application is based, is incorporated herein by reference in its entirety.

What is claimed is:

1. A high frequency power amplifier comprising:
   an FET chip;
   a wire connected at a first end to said FET chip;
   an input-side matching circuit substrate;
   a resistive element located on said input-side matching circuit substrate and connected in series with said FET chip; and
   a conductive material located on said input-side matching circuit substrate, wherein said conductive material includes
      a transmission portion in contact with a first end of said resistive element and connected to an input electrode,
      a wire connection portion in contact with a second end of said resistive element, and connected to a second end of said wire, and
      a shorting portion having a smaller width than said resistive element, located on said resistive element, and connecting said transmission portion of said conductive material to said wire connection portion of said conductive material.

2. The high frequency power amplifier according to claim 1, including a plurality of said shorting portions located on said resistive element.

3. The high frequency power amplifier according to claim 1, wherein said shorting portion has a length longer than a minimum length required to connect said wire connection portion to said transmission portion.

4. The high frequency power amplifier according to claim 1, wherein said wire connection portion has a length, as measured along a transmission direction of a high frequency signal being transmitted through said high frequency amplifier, in a range from 50 μm to 100 μm.

5. The high frequency power amplifier according to claim 1, wherein said resistive element comprises TaN.

* * * * *